(12) United States Patent
Lin et al.

(10) Patent No.: US 6,690,054 B2
(45) Date of Patent: Feb. 10, 2004

(54) CAPACITOR

(75) Inventors: Jun Lin, Kawasaki (JP); Chung-Ming Chu, Hsinchu (TW); Toshiya Suzuki, Kawasaki (JP); Katsuhiko Hieda, Yokohama (JP)

(73) Assignees: Fujitsu Limited, Kawasaki (JP); Windbond Electronics Corp., Hsinchu (TW); Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/173,596

(22) Filed: Jun. 19, 2002

(65) Prior Publication Data

US 2003/0107076 A1 Jun. 12, 2003

(30) Foreign Application Priority Data

Oct. 30, 2001 (JP) .......................................... 2001-332706

(51) Int. Cl.$^7$ ..................... H01L 27/108; H01L 29/76; H01L 29/94; H01L 31/119
(52) U.S. Cl. ..................... 257/306; 257/309; 257/310
(58) Field of Search ................ 257/295–310; 438/239–254, 3

(56) References Cited

U.S. PATENT DOCUMENTS 6,078,072 A * 6/2000 Okudaira et al. ........... 257/295
6,403,414 B2 * 6/2002 Marsh ........................ 438/239

* cited by examiner

Primary Examiner—Cuong Nguyen
(74) Attorney, Agent, or Firm—Westerman, Hattori, Daniels & Adrian, LLP

(57) ABSTRACT

A method for fabricating a capacitor comprises the steps of: forming a lower electrode of a metal over a substrate; forming a capacitor dielectric film of an oxide dielectric film on the lower electrode; depositing a metal film on the capacitor dielectric film; performing a thermal processing in a hydrogen-content atmosphere after the step of depositing the metal film; and patterning the metal film to form an upper electrode of the metal film after the step of performing the thermal processing. Thus, the adhesion between the upper electrode and the capacitor dielectric film is improved, and capacitor characteristics can be improved.

4 Claims, 17 Drawing Sheets

AFTER N₂ ANNEALING

AFTER FGA+N₂ ANNEALING

N₂ ANNEALING    PEELING

FGA+N₂ ANNEALING

CAPACITOR

BACKGROUND OF THE INVENTION

The present invention relates to a capacitor of an MIM (Metal-Insulator-Metal) structure, more specifically a capacitor which can prevent peeling at the interface between the electrode and the capacitor dielectric film and deterioration of capacitor characteristics due to thermal processing and a method for fabricating the capacitor, and a method for fabricating a semiconductor device including such the capacitor.

DRAM is a semiconductor memory device which can be constituted by one transistor and one capacitor, and have been studied in structures and methods for fabricating semiconductor memory devices of high density and high integration. Especially areas occupied by capacitors much influence integration of devices, so that it is very important how to increase a capacitance per a unit area. To this end, for DRAM of giga-bit storage capacities, which have been recently developed, it has been studied in order to decrease areas occupied by the capacitors that the capacitor dielectric film is formed of metal oxide, whose dielectric constant is higher than those of silicon oxide film and silicon nitride film, which have been conventionally widely used. As such oxide dielectric films, oxide dielectric film, such as tantalum oxide film, BSTO film, STO film, PZT film, etc., have been studied.

Such oxide dielectric films as the capacitor dielectric film have been usually formed by CVD method. This is because the films formed by CVD method have high dielectric constants, low leakage current, and good step coverage. As electrode materials, noble metal material as of ruthenium (Ru) have been used. This is because noble metal films have good adhesion to oxide dielectric films and can form capacitors having large work function difference and low leakage current.

However, the inventors of the present application made various studies and have found that when an upper electrode is formed of a metal material on the oxide dielectric film, peeling at the interface between the oxide dielectric film and the upper electrode takes place due to later thermal processing.

In the usual semiconductor process, thermal processing after the uppermost passivation film has been formed is performed in a forming gas atmosphere for improving transistor characteristics. However, this thermal processing has often degraded electric characteristics of the capacitor.

SUMMARY OF THE INVENTION

An object of the present invention is to provide a semiconductor device and a method for fabricating the same which can prevent peeling between the upper electrode and the oxide dielectric film and can suppress capacitor characteristic degradation.

According to one aspect of the present invention, there is provided a capacitor comprising: a lower electrode of a metal; a capacitor dielectric film of an oxide dielectric film formed on the lower electrode; and an upper electrode of a metal formed on the capacitor dielectric film, an impurity concentration in the lower electrode being different from that in the upper electrode.

According to another aspect of the present invention, there is provided a method for fabricating a capacitor comprising the steps of: forming a lower electrode of a metal over a substrate; forming a capacitor dielectric film of an oxide dielectric film on the lower electrode; depositing a metal film on the capacitor dielectric film; performing a thermal processing in a hydrogen-content atmosphere after the step of depositing the metal film; and patterning the metal film to form an upper electrode of the metal film after the step of performing the thermal processing.

According to further another aspect of the present invention, there is provided a method for fabricating a capacitor comprising the steps of: forming a lower electrode of a metal over a substrate; forming a capacitor dielectric film of an oxide dielectric film on the lower electrode; and forming an upper electrode of a metal on the capacitor dielectric film, conditions for forming the lower electrode and the upper electrode being controlled so that an oxygen concentration in the upper electrode is higher than that in the lower electrode.

According to further another aspect of the present invention, there is provided a method for fabricating a semiconductor device comprising the steps of: forming a lower electrode of a metal over a semiconductor substrate; forming a capacitor dielectric film of an oxide dielectric film on the lower electrode; depositing a metal film on the capacitor dielectric film; performing a thermal processing in a hydrogen-content atmosphere after the step of depositing the metal film; and patterning the metal film to form an upper electrode of the metal film after the step of performing the thermal processing.

According to further another aspect of the present invention, there is provided a method for fabricating a semiconductor device comprising the steps of: forming a lower electrode of a metal over a semiconductor substrate; forming a capacitor dielectric film of an oxide dielectric film on the lower electrode; forming an upper electrode of a metal on the capacitor dielectric film; performing a thermal processing in a hydrogen-content atmosphere after the step of forming the upper electrode; and forming an uppermost passivation film over the upper electrode after the step of performing the thermal processing.

As described above, according to the present invention, thermal processing is performed in a hydrogen-content atmosphere after a metal film to be the upper electrode has been deposited and before the patterning, whereby a carbon concentration of the upper electrode is decreased to thereby improve the adhesion between the capacitor dielectric film and the upper electrode, which prevents the peeling of the upper electrode.

The metal film to be the upper electrode is formed under conditions which allow the upper electrode contain a high concentration of oxygen, whereby the adhesion between the capacitor dielectric film and the upper electrode can be improved, which prevents the peeling of the upper electrode.

Thermal processing is performed in a hydrogen-content atmosphere after the upper electrode has been formed and before the uppermost passivation film is formed, whereby damage in the back end process can be decreased, which can improve capacitor characteristics.

DETAILED DESCRIPTION OF THE INVENTION

[The Principle of the Invention]

As described above, it has been found that when an upper electrode of a metal material is formed on an oxide dielectric film, later thermal processing causes peeling at the interface between the oxide dielectric film and the upper electrode.

A cause for the peeling will be low adhesion between the capacitor dielectric film and the upper electrode. Then, the inventors of the present application made earnest studies of causes for the degradation of the adhesion and have presumed that carbon taken in the film in the process of forming the upper electrode is a cause. The carbon taken in the film is contained in an organic metal material forming the upper electrode. It is difficult to perfectly remove the carbon when the film of the upper electrode is formed by CVD method.

Then, in the present invention, the adhesion between the capacitor dielectric film and the upper electrode can be improved by the following two methods. The present invention will be detailed by means of an example that the capacitor dielectric film is formed of tantalum oxide film, and the upper electrode is formed of ruthenium film.

In a first method, a ruthenium film to be the upper electrode is deposited, and the ruthenium film is thermally processed in a forming gas atmosphere before the patterning of the ruthenium film. The forming gas is a reducing gas formed of hydrogen gas-content nitrogen gas or argon gas, and also containing hydrogen be 10%. The thermal processing is performed in the forming gas atmosphere to thereby effectively remove carbon in the ruthenium film. A carbon concentration near the interface between ruthenium film and tantalum oxide film is much decreased to thereby improve adhesion between the ruthenium film and tantalum oxide film.

The thermal processing in the forming gas atmosphere is effectively performed in a range of the room temperature to 450° C. It is preferable that specific processing conditions are set suitably corresponding to a concentration of carbon contained in the upper electrode, etc.

Figure 1:
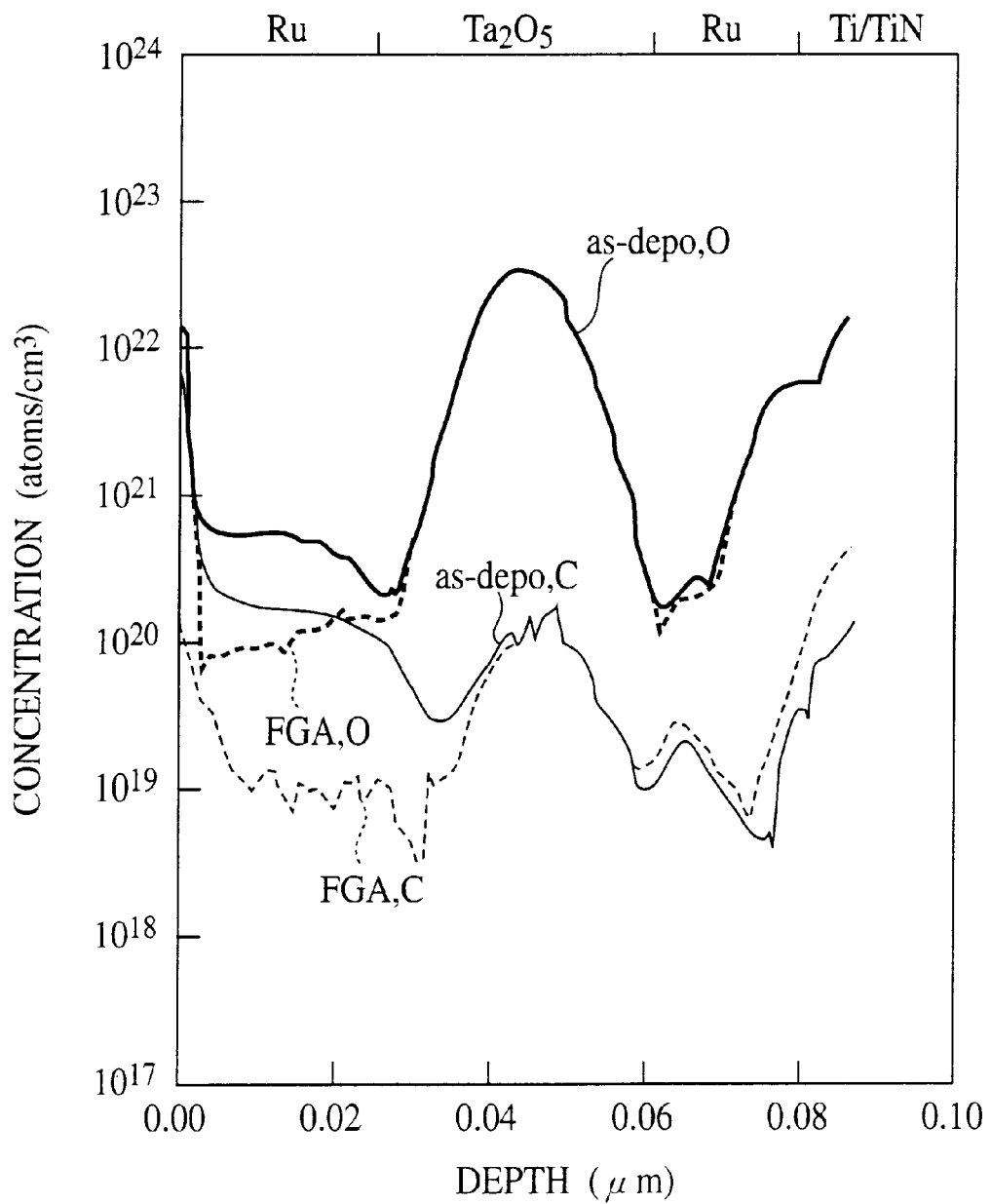
FIG. 1 is a graph of carbon and hydrogen distributions in the capacitors measured by secondary ion mass spectroscopy before and after thermal processing in a forming gas atmosphere.

FIG. 1 is a graph of the carbon distributions and oxygen distributions in the capacitor before and after the thermal processing in the forming gas atmosphere which were measured by secondary ion mass spectroscopy. As seen in the graph, it is found that the thermal processing in the forming gas atmosphere can much decrease the carbon concentration in the ruthenium film.

Figure 2A:
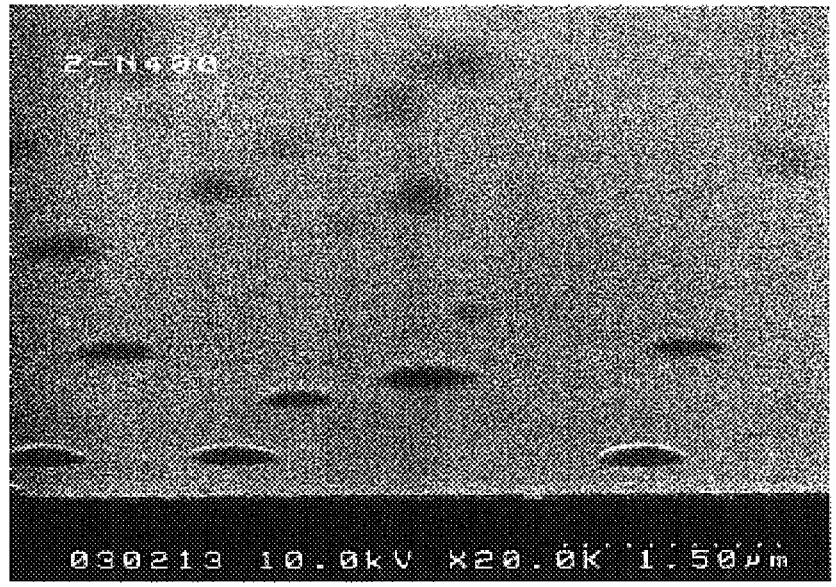
FIGS. 2A and 2B are views of samples subjected to thermal processing after the upper electrode has been formed, which were observed by a scanning electron microscope.
Figure 2B:
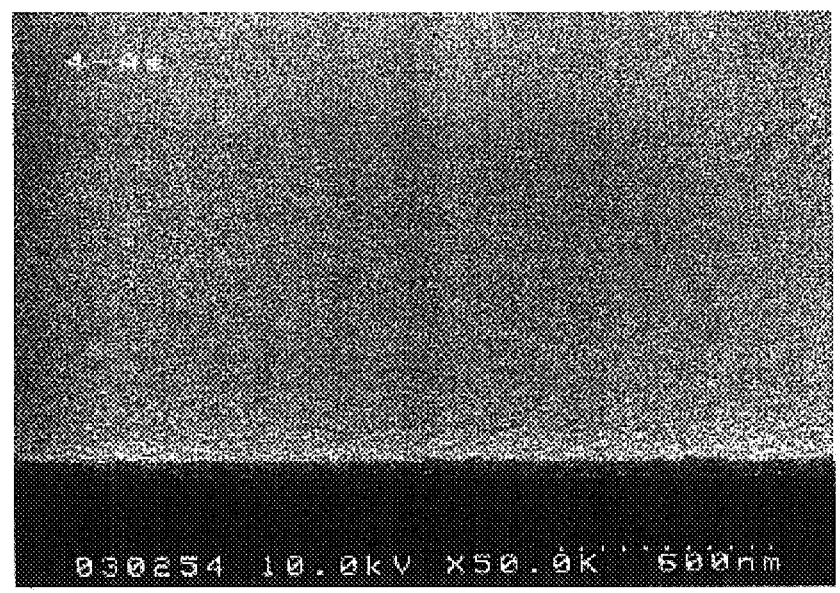

FIGS. 2A and 2B are views of samples subjected to the thermal processing after the upper electrode has been formed, which was observed by a scanning electron microscope. FIG. 2A shows the sample which was subjected to the thermal processing in a nitrogen atmosphere at 400° C. for 1 hour ($N_2$ annealing) after the upper electrode was formed. FIG. 2B is the sample which was subjected to the thermal processing in the forming gas atmosphere at 400° C. for 1 hour (FGA) and the thermal processing at 400° C. for 1 hour ($N_2$ annealing) after the upper electrode has been formed.

As shown, in the sample subjected only to the thermal processing in a nitrogen atmosphere, it is found that raised regions are observed on the surface of the upper electrode, and the peeling has taken place between the capacitor dielectric film and the upper electrode. On the other hand, in the sample subjected to the thermal processing in the forming gas atmosphere and the thermal processing in a nitrogen atmosphere, it is found that the peeling is not observed. It is found that the thermal processing in the forming gas atmosphere prevents the peeling by the later thermal processing in the nitrogen atmosphere.

TABLE 1 shows relationships between the thermal processing conditions and the peeling of the upper electrode.

TABLE 1

| Thermal Processing Conditions | Planar Capacitor | Cylindrical Capacitor |
| --- | --- | --- |
| $N_2$, 300° C., 1 hour | No peeling | No peeling |
| $N_2$, 400° C., 1 hour | Peeling | Peeling |
| $N_2$, 500° C., 1 hour | Peeling | Peeling |
| Vacuum, 400° C., 1 hour | Peeling | Peeling |
| $O_2$, 400° C., 1 hour | Peeling | Peeling |
| $O_2$, 450° C., 1 hour | Peeling | Peeling |
| FGA, 400° C., 1 hour + $N_2$, 400 – 500° C., 1 hour | No peeling | No peeling |
| FGA, 400° C., 1 hour + $O_2$, 400 – 500° C., 1 hour | No peeling | No peeling |
| FGA, 400° C., 1 hour + $N_2$, 400 – 500° C., 1 hour + FGA, 400° C., 1 hour + | No peeling | No peeling |
| FGA, 400° C., 1 hour + $O_2$, 400 – 500° C.,1 hour + FGA 400° C., 1 hour | No peeling | No peeling |

As shown in TABLE 1, in the thermal processing in the nitrogen atmosphere, in vacuum and in the oxygen atmosphere performed after the upper electrode has been formed, the peeling took place under the all the conditions except for the low temperature (300° C.) thermal processing. On the other hand, the peeling did not take place in the thermal processing in the forming gas atmosphere (FGA) performed after the capacitor has been formed even when the thermal processing in the nitrogen atmosphere and the oxygen atmosphere are further conducted. Thus, it was found that the thermal processing in the forming gas atmosphere, i.e., in hydrogen-content atmospheres is every effective to prevent the peeling.

It is generally recognized that the thermal processing in a forming gas atmosphere degrades electric characteristics of a capacitor. However, the studies made by the inventors of the present application have made clear that the thermal processing after the deposition of a ruthenium film and before patterning rather improves electric characteristics of the capacitor.

Figure 3:
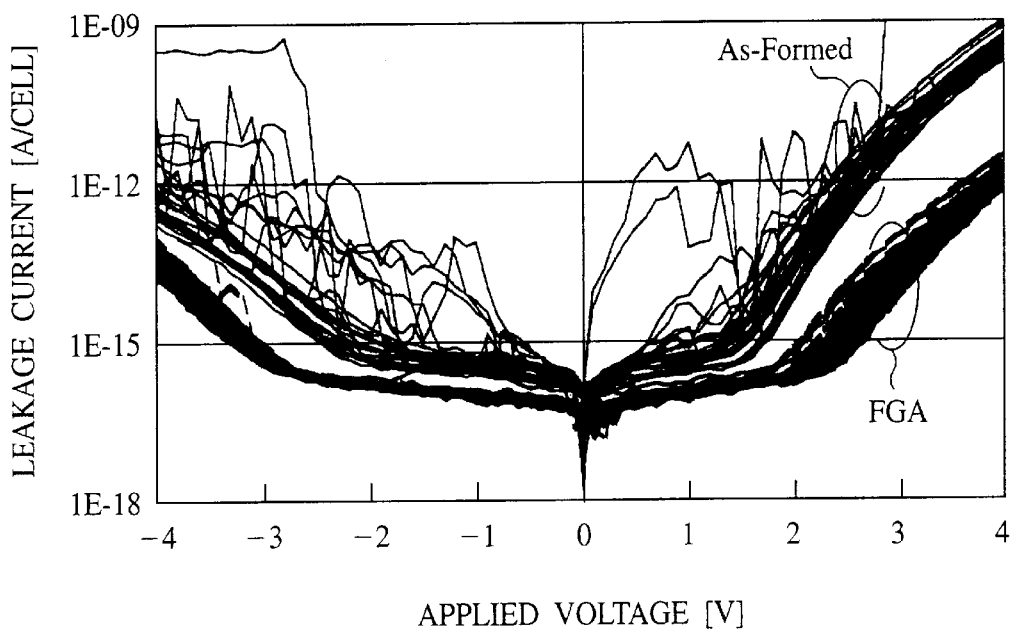
FIG. 3 is a graph of measured leakage current of the capacitors.

FIG. 3 is a graph of measured leakage current of the capacitor. In the graph, "As-Formed" means electric characteristics of the capacitor without the thermal processing in the forming gas atmosphere. "FGA" means electric characteristics of the capacitor with the thermal processing in the forming gas atmosphere. For each condition, a plurality of lines are indicated. This is because leakage current was measured on 29 capacitors for each condition, and the characteristics of all the capacitors are shown.

As seen in the graph, the samples which have not been subjected to the thermal processing in the forming gas atmosphere have large characteristics fluctuation and leakage current. However, both the characteristics fluctuation and leakage current could be drastically decreased by performing the thermal processing in the forming gas atmosphere.

It is important that the thermal processing in the forming gas atmosphere is performed before patterning for forming the upper electrode. Sufficient improvement of electric characteristics of the capacitor cannot be expected by performing the thermal processing the forming gas atmosphere after the patterning for forming the upper electrode. Although, no exact mechnism for this has not been grasped, it is presumed that when the patterning is performed before the thermal processing in the forming gas, fluorine (F) and $CF_4$, which are used for the dry etching of the ruthenium film, remain on the surfaces of the samples, and the thermal processing in the forming gas in this state generates HF in the atmosphere, which damages the tantalum oxide film.

From the view point of decreasing contaminant concentrations in the lower electrode, the thermal processing may be performed after the lower electrode has been formed and before the capacitor dielectric film is formed.

In the second method, film forming conditions for forming a ruthenium film forming the lower electrode are made different from those for forming a ruthenium film forming the upper electrode. To be specific, the film of the lower electrode is formed under conditions which make concentrations of impurities (carbon or oxygen) taken in the film lower, and the film of the upper electrode is formed under conditions which make an oxygen concentration in the film higher.

As evident in FIG. 1, the thermal processing in the forming gas after the formation of the upper electrode is less effective to remove impurity from the lower electrode in comparison with that from the upper electrode. Accordingly, it is preferable in the process of forming the lower electrode that the thermal processing in the forming gas is performed under conditions which make concentrations of impurities taken in the film low. On the other hand, when oxygen is taken in the upper electrode in a high concentration, the adhesion to the capacitor dielectric film, which is an oxide, can be improved. Thus, it is preferable in the process of forming the upper electrode that ruthenium film is formed under conditions which make an oxygen concentration in the film high.

As one means for thus controlling the film forming conditions, it is considered to make film forming temperatures of ruthenium film different from each other. In a case that $Ru(EtCp)_2$ is used as a ruthenium source, when a film forming temperature is, e.g., 300° C., an oxygen concentration in the film is about $1 \times 10^{21}$ cm$^{-3}$, and a carbon concentration is about $5 \times 10^{20}$ cm$^{-3}$. When a film forming temperature is, e.g., 330° C., an oxygen concentration in the film is $1 \times 10^{20}$ cm$^{-3}$, and a carbon concentration is about $1 \times 10^{20}$ cm$^{-3}$. Accordingly, when the above-described film forming conditions are used, the lower electrode is formed at 330° C., and the upper electrode is formed at 300° C., whereby an impurity concentration in the lower electrode can be decrease while the adhesion of the upper electrode can be improved.

Otherwise, and oxygen concentration in the upper electrode can be made higher than that in the lower electrode by making a flow rate ratio of a ruthenium source to oxygen gas for forming the upper electrode lower than that of a ruthenium source to oxygen gas for forming the lower electrode.

A high concentration of oxygen in the upper electrode is effective not only to contribute the adhesion improvement but also to improve electric characteristics of the capacitor. That is, oxygen contained in the upper electrode is diffused into the capacitor dielectric film by the thermal processing in a later step to act to make a composition of the tantalum oxide film to a stoichiometric composition. Thus, the capacitor dielectric film of good quality can be formed.

When the film forming conditions of 300° C. are used, concentrations of carbon taken in the film are higher. The combination with the thermal processing in the forming gas atmosphere is more effective to remove the carbon so as to further improve the adhesion.

The inventors of the present application made various studies as to a timing of performing the thermal processing in the forming gas atmosphere and have made clear for the first time that the thermal processing in the forming gas atmosphere made in the back end processing is effective to improve electric characteristics of the capacitor. Specifically, the thermal processing in the forming gas atmosphere is made after an inter-layer insulation film covering the capacitor and an electrode plug connected to the upper electrode, etc. through the inter-layer insulation film has been formed, whereby electric characteristics of the capacitor can by improved.

Figure 4:
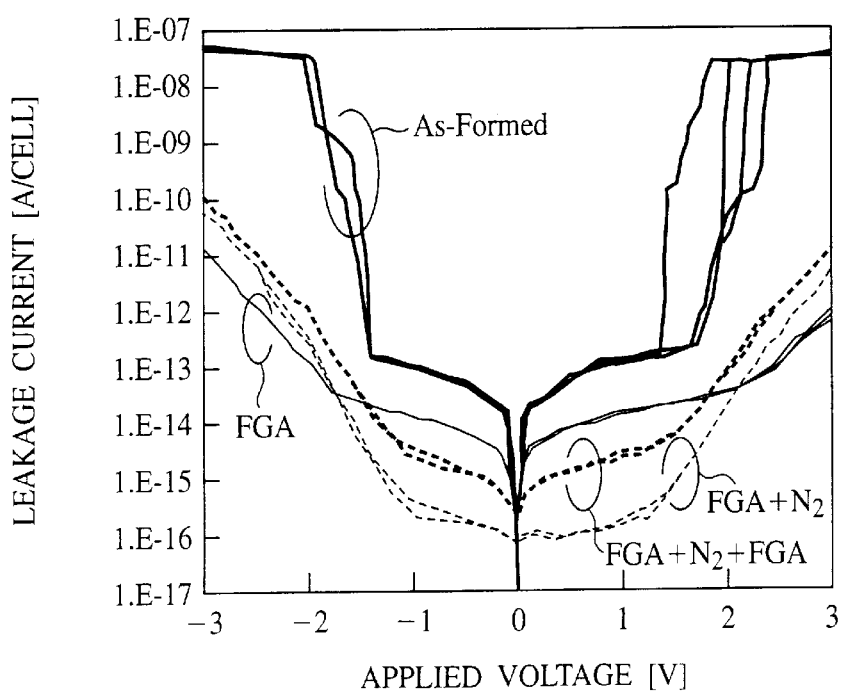
FIG. 4 is a graph of measured leakage current of the capacitors.

FIG. 4 is a graph of measured leakage current of the capacitor. In the graph, "As-Formed" indicates electric characteristics of the capacitor in the case that the thermal processing was performed immediately after the capacitor and the electrode plug have been formed; "FGA" indicates those in the case that the thermal processing was performed in the forming gas atmosphere after the capacitor and the electrode plug have been formed; "FGA+$N_2$" indicates those in the case that the thermal processing in the forming gas atmosphere and the thermal processing in an nitrogen gas atmosphere after the capacitor and the electrode plug have been formed; "FGA+$N_2$FGA" indicates those in the case that the thermal processing in the forming gas atmosphere and the therma processing in an nitrogen atmosphere, and further the thermal processing in the forming gas atmosphere were performed after the capacitor and the electrode plug have been formed. A plurality of lines are found for each case because the measurement was made on 3 to 4 capacitors for each case, and the measured characteristics are all shown.

As shown, a series of back end processes for forming the electrode plug degrade electric characteristics of the capacitor. This degradation will be due to plasma damages, etc. in the contact hole forming step. However, leakage current of the capacitor can be much decreased by performing the thermal processing in the forming gas atmosphere. The leakage current can be further decreased by performing the thermal processing in a nitrogen atmosphere following the thermal processing in the forming gas atmosphere.

In the case that the thermal processing in the forming gas atmosphere and the thermal processing in an nitrogen atmosphere, and the thermal processing in the forming gas atmosphere are performed, and the thermal processing in the forming gas atmosphere are further performed after the capacitor and the electrode plug have been formed, in consideration of the thermal processing in the forming gas atmosphere performed at the end of the back end processes for electric characteristics improvement of the transistor, the electric characteristics are more degraded than in the case that the thermal processing in the forming gas atmosphere and the thermal processing in the nitrogen atmosphere are performed. However, it has been found that the electric characteristics obtained in this case are better than in the case ("As-Formed") that forming gas anneal is not performed in the back end processes.

[Embodiments]

The semiconductor device and the method for fabricating the same according to one embodiment of the present invention will be explained with reference to FIGS. 5, 6, 7A–7D, 8A–8C, 9A–9D, 10A–10C, 11A–11B, 12A–12B, 13A–13B, 14–17, and 18A–18B.

Figure 5:
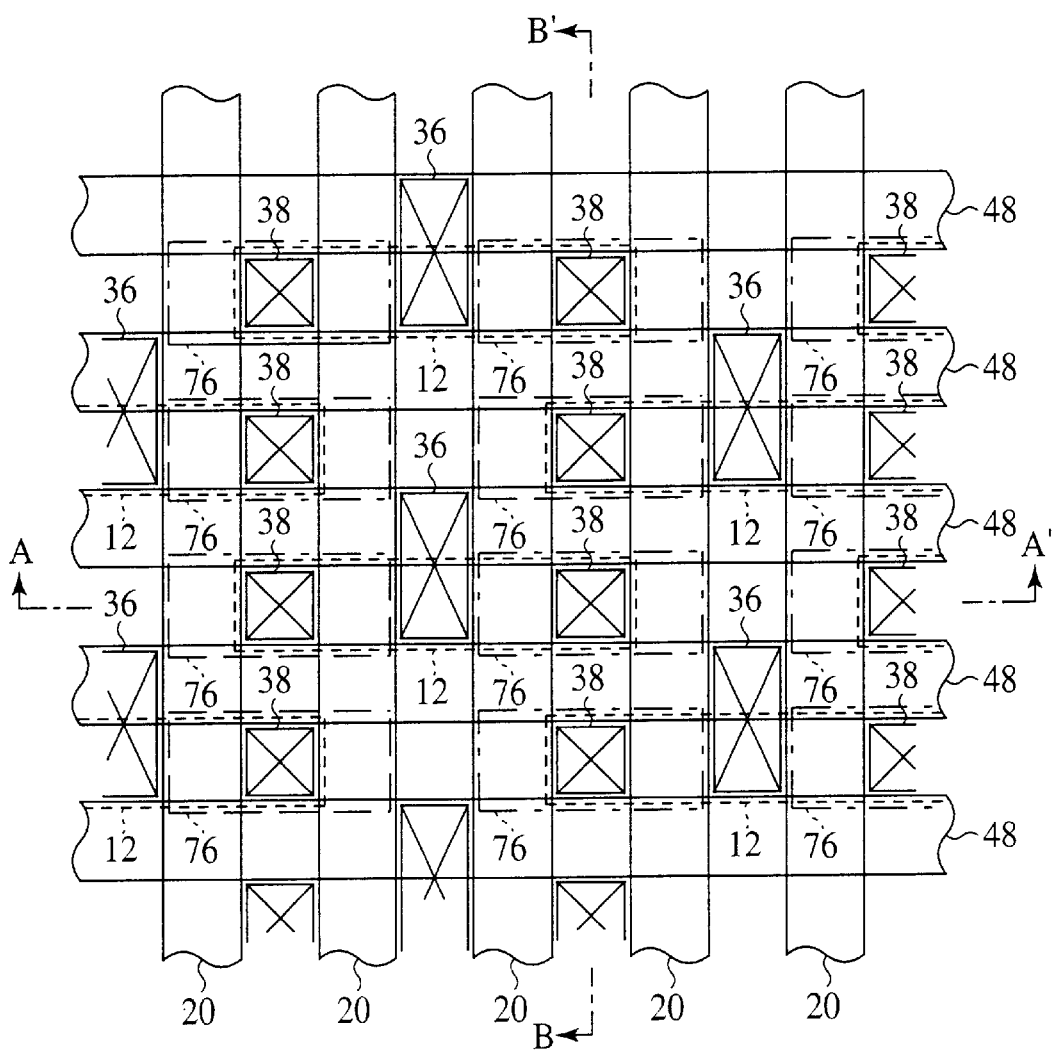
FIG. 5 is a plan view of the semiconductor device according to one embodiment of the present invention, which shows a structure thereof.
Figure 6:
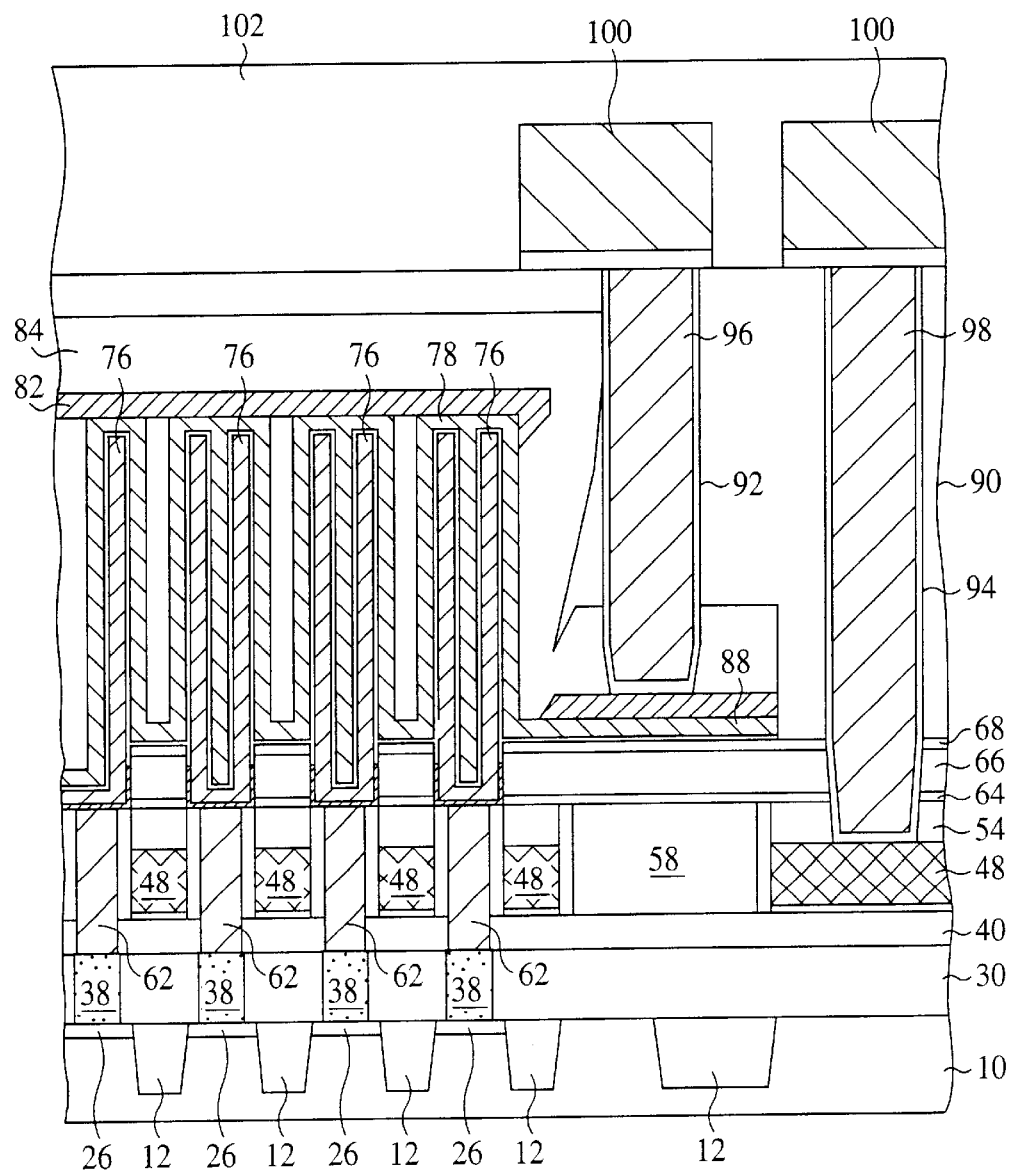
FIG. 6 is diagrammatic sectional view of the semiconductor device according to the embodiment of the present invention, which shows the structure thereof.

FIG. 5 is a plan view of the semiconductor device according to the present embodiment, which show a structure thereof. FIG. 6 is a diagrammatic sectional view of the semiconductor device according to the present embodiment, which shows the structure thereof. FIGS. 7A–7D, 8A–8C, 9A–9D, 10A–10C, 11A–11B, 12A–12B, 13A–13B, and 14–17 are sectional views of the semiconductor device according to the present embodiment in the steps of the method for fabricating the same, which show the method. FIGS. 18A and 18B are sectional structures of the semiconductor devices observed by a scanning electron microscope.

First, the structure of the semiconductor device according to the present embodiment will be explained with reference to FIGS. 5 and 6.

A device isolation film 12 for defining device regions is formed on a silicon substrate 10. Memory cell transistors each comprising a gate electrode 20 and a source/drain diffused layer 24, 26 are formed in the device regions. As shown in FIG. 5, the later electrodes 20 function as a conducting film which functions also as word lines. An inter-layer insulation film 30 with plugs 36 connected to the source/drain diffused layer 24 and plugs 38 connected to the source/drain diffused layer 26 buried in is formed on the silicon substrate 10 with the memory cell transistors formed on.

An inter-layer insulation film 40 is formed on the inter-layer insulation film 30. Bit lines 48 are formed on the inter-layer insulation film 40, electrically connected to the source/drain diffused layer 24 via the plugs 36. As shown in FIG. 5, a plurality of bit lines 48 are formed, crossing the word lines (gate electrodes 20). An inter-layer insulation film 58 is formed on the inter-layer insulation film 40. Plugs 62 are buried in the inter-layer insulation film 58, electrically connected to the plugs 38.

An etching stopper film 64, an inter-layer insulation film 66 and an etching stopper film 68 are formed on the inter-layer insulation film 58. Cylindrical storage electrodes 76 are formed, projected beyond the etching stopper film 68, and passed through the etching stopper film 68, the inter-layer insulation film 66 and the etching stopper film 64 and electrically connected to the plugs 62. A plate electrode 88 of ruthenium film is formed over the storage electrodes 76 interposing a capacitor dielectric film 78 of tantalum oxide film ($Ta_2O_5$) therebetween.

A TiN film 82 and an inter-layer insulation films 84, 90 are formed on the plate electrode 88. An interconnection layer 100 is formed on the inter-layer insulation film 90, electrically connected to the plate electrode 88 via the plugs 96 and the TiN film 82, or electrically connected to the bit lines 48 via the plugs 98. An inter-layer insulation film 102 is formed on the inter-layer insulation film 90 with the interconnection layer 100 formed on.

Thus, a DRAM comprising memory cells each comprising one transistor and one capacitor is formed.

Here, one characteristic of the semiconductor device according to the present embodiment is that a carbon concentration of the plate electrode 88 is lower than that of the storage electrodes 76. In the semiconductor device according to the present embodiment, a carbon concentration of the plate electrode 88 is lower than that of the storage electrodes 76 so as to improve the adhesion between the capacitor dielectric film 78 and the plate electrode 88 as described above. The carbon concentration of the electrodes is thus controlled, whereby the peeling due to the thermal processing in later steps can be prevented.

Such electrode constitution having such carbon concentrations can be formed by depositing a ruthenium film to be the plate electrode 88 and then subjecting the ruthenium film to the thermal processing in the forming gas atmosphere before patterning.

Then, the method for fabricating the semiconductor device according to the present embodiment will be explained with reference to FIGS. 7A–7D, 8A–8C, 9A–9D, 10A–10C, 11A–11B, 12A–12B, 13A–13B, and 14–17. FIGS. 7A–7D and 8A–8C are sectional views of the semiconductor device along the line A–A' in the steps of the method for fabricating the same. FIGS. 9A–9D, 10A–10C, 11A–11B, 12A–12B, 13A–13B, and 14–17 are sectional views of the semiconductor device along the line B–B' in the steps of the method for fabricating the same.

Figure 7A:
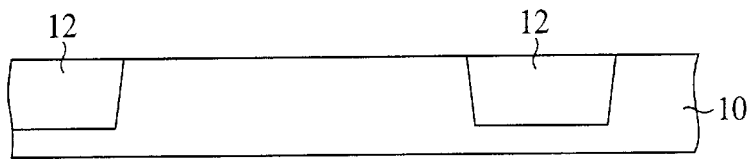
FIGS. 7A–7D, 8A–8C, 9A–9D, 10A–10C, 11A–11B, 12A–12B, 13A–13B, and 14–17 are sectional views of the semiconductor device according to the embodiment of the present invention in the steps of the method for fabricating the same, which show the method.

First, the device isolation film 12 is formed on the main surface of a silicon substrate 10 by, e.g., STI (Shallow Trench Isolation) method (FIG. 7A). For example, a 100 nm-thick silicon nitride film is formed on the silicon substrate 10 (not shown). Then, the silicon nitride is patterned so as to remain in regions to be the device regions. Then, with the patterned silicon nitride film as a hard mask, the silicon substrate 10 is etched to form a device isolation trench of, e.g., a 200 nm-depth. Next, a silicon oxide film is deposited on the entire surface by, e.g., CVD method, and then the silicon oxide film is polished by CMP (Chemical Mechanical Polishing) method until the silicon nitride film is exposed to leave the silicon oxide film selectively in the device isolation trench. Then, the silicon nitride film is removed to form the device isolation film 12 of the silicon oxide film buried in the device isolation trench in the silicon substrate 10.

Then, P-wells (not shown) are formed in the silicon substrate 10 in the memory cell regions, and ion implantation is performed for controlling a threshold voltage.

Next, a gate insulation film 14 of a silicon oxide film of, e.g., a 5 nm-thick is formed on a plurality of the device region defined by the device isolation film 12. The gate insulation film 14 may be an insulation film, as of silicon oxynitride film or others, other than silicon oxide film.

Figure 7B:
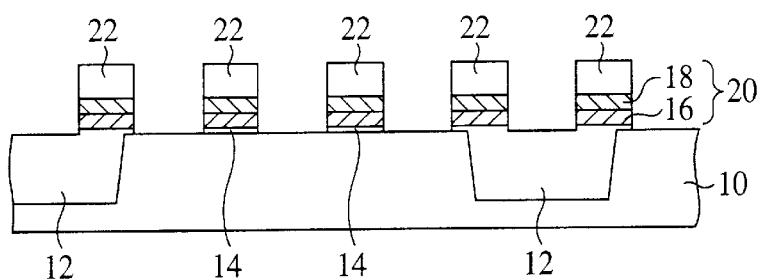

Then, the gate electrodes 20 of, e.g., a polymethyl structure of a layer film of a polycrystalline silicon film 16 and a tungsten film 18 are formed on the gate insulation film 14 (FIG. 7B). For example, a 70 nm-thick polycrystalline silicon film 16, a 5 nm-thick tungsten nitride (WN) film (not shown), a 40 nm-thick tungsten film 18 and a 200 nm-thick silicon nitride film 22 are sequentially deposited, patterned in the same configuration by lithography and etching to form the gate electrodes 20 of the polymethyl structure having the upper surface covered with the silicon nitride film 22 and having the polycrystalline silicon film 16 and the tungsten film 18 laid on the former on the latter with the tungsten nitride film therebetween. The gate electrodes 20 do not essentially have the polymethyl structure and may have a polygate structure or a polycide gate structure, or may be a metal gate or others.

Then, with the gate electrodes 20 as a mask, ion implantation is performed to form the source/drain diffused layer 24, 26 in the silicon substrate 10 on both sides of the gate electrodes 20.

Thus, the memory cell transistors having the gate electrodes 20, the source/drain diffused layer 24, 26 are formed on the silicon substrate 10.

Figure 7C:
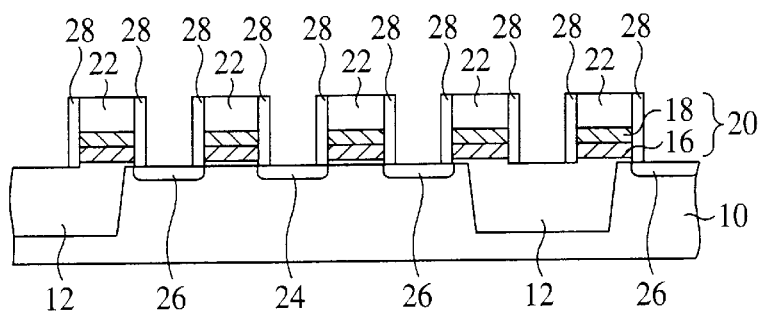
Figure 9A:
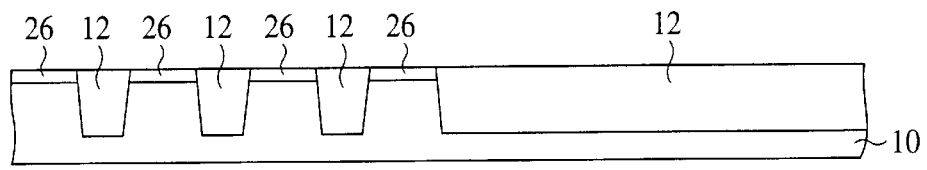

Next, a silicon nitride film of, e.g., a 35 nm-thick is formed on the entire surface by, e.g., CVD method and etched back to form a sidewall insulation film 28 of the silicon nitride film on the side walls of the gate electrodes 20 and the silicon nitride film 22 (FIGS. 7C and 9A).

Then, a BPSG film, for example, is deposited on the entire surface by, e.g., CVD method, and then the surface of the BPSG film is reflowed, polished by CMP method or others until the silicon nitride film 22 is exposed to form the inter-layer insulation film 30 of the BPSG film having the surface planarized.

Figure 7D:
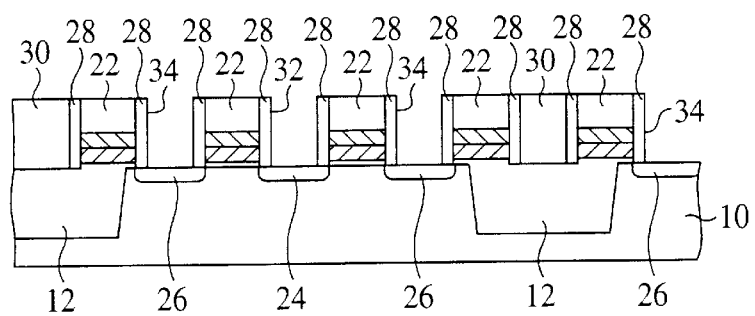
Figure 9B:
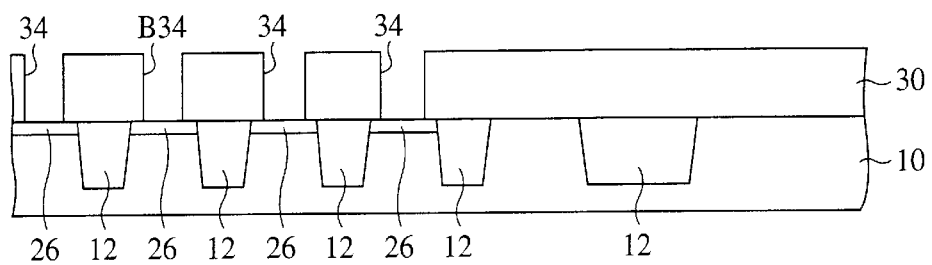

Next, by lithography and etching, contact holes 32, 34 are formed in the inter-layer insulation film 30 respectively down to the source/drain diffused layer 26 and down to the source/drain diffused layer 26 by self-alignment to the gate electrodes 20 and the sidewall insulation film 28 (FIG. 7D, FIG. 9B).

Figure 8A:
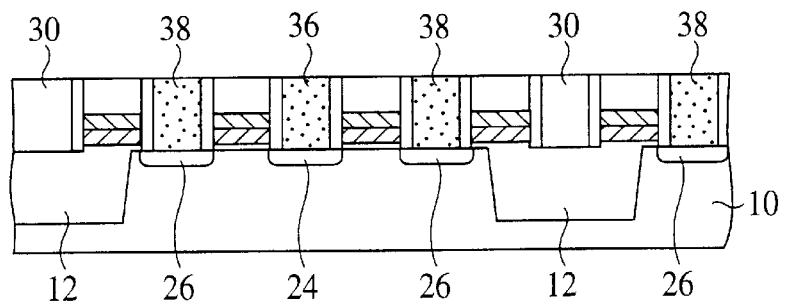
Figure 9C:
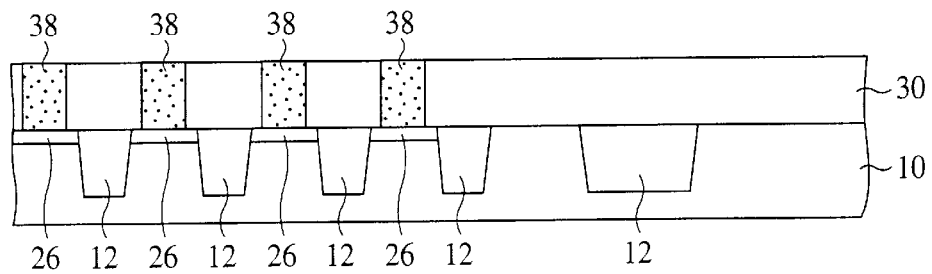

Then, plugs 36, 38 are buried respectively in the contact holes 32, 34 opened in the inter-layer insulation film 30 (FIG. 8A, FIG. 9C). For example, an arsenic-doped polycrystalline silicon film is deposited by CVD method and then polished until the silicon nitride film 22 is exposed to leave the plugs 36, 38 of the polycrystalline silicon film only in the contact holes 32, 34.

Next, a silicon oxide film of, e.g., a 200 nm-thick is deposited on the entire surface by, CVD method to form the inter-layer insulation film 40 of the silicon oxide film.

Figure 8B:
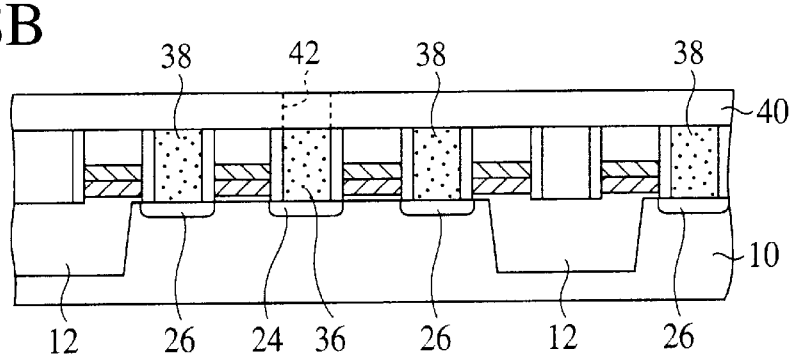
Figure 9D:
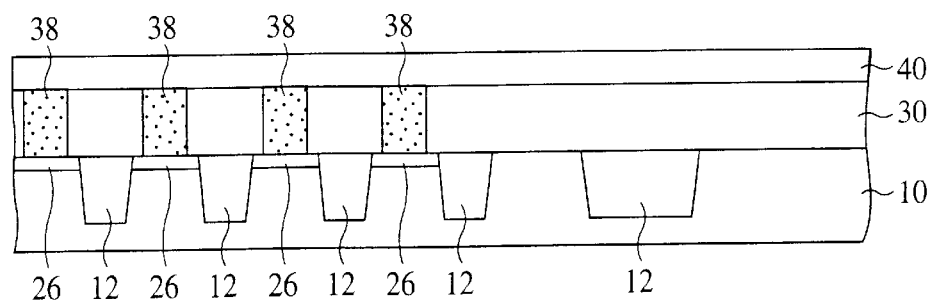

Then, contact holes 42 are formed in the inter-layer insulation film 40 down to the plugs 36 by lithography and etching (FIG. 8B, FIG. 9D).

Figure 8C:
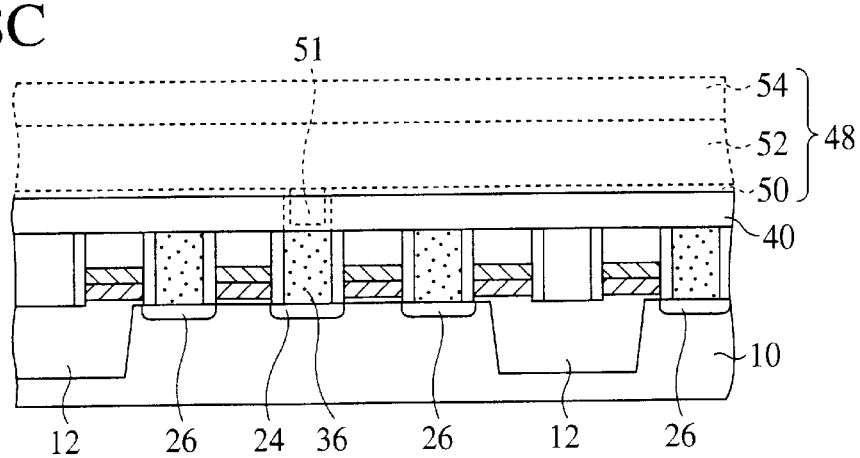
Figure 10A:
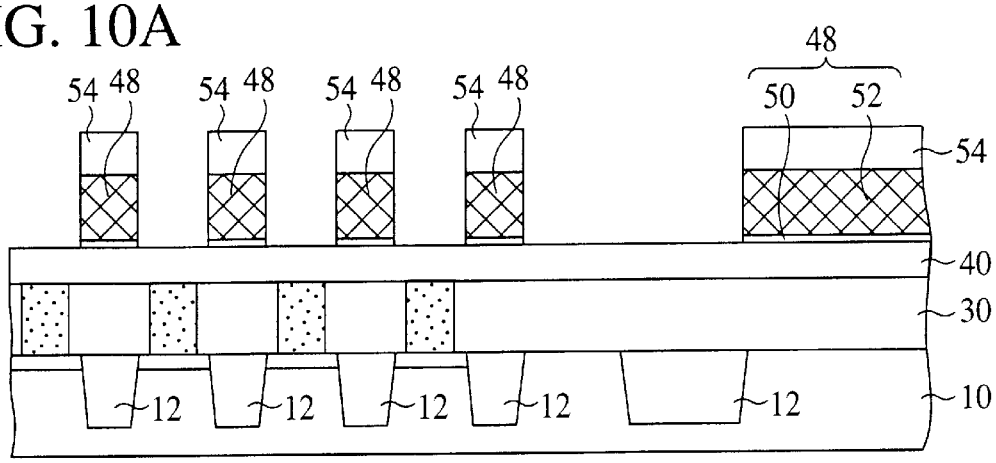

Next, the bit lines 48 electrically connected to the plugs 36 via the contact holes 42 are formed on the inter-layer insulation film 40 (FIG. 8C, FIG. 10A). For example, first, an adhesion layer 50 of the layer structure of a 45 nm-thick titanium nitride (TiN)/titanium (Ti), and a 250 nm-thick tungsten (W) film 51 are sequentially deposited. Then, the tungsten film 51 is polished by CMP method to bury the plugs of the tungsten film 51 in the contact holes 42. Then, a 30 nm-thick tungsten film 52 is deposited by sputtering method. Next, a 200 nm-thick silicon nitride film 54 is deposited on the tungsten film 52 by CVD method. Next, the silicon nitride film 54, the tungsten film 52 and the adhesion layer 50 are patterned by lithography and etching to form the bit lines 48 having the upper surface covered with the silicon nitride film 54, formed of the adhesion layer 50 and the tungsten film 52 and electrically connected to the source/drain diffused layer 24 via the plugs 36.

Figure 10B:
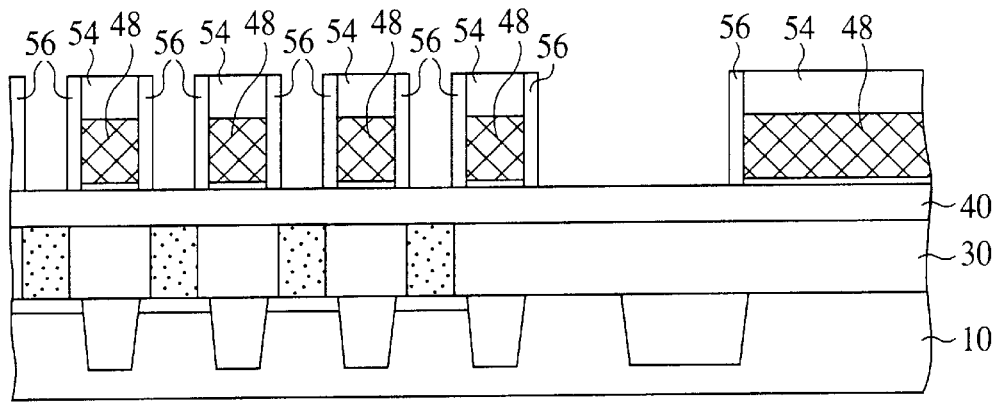

Next, a silicon nitride film of, e.g., a 20 nm-thick is deposited on the entire surface by, e.g., CVD method and etched back to form the sidewall insulation film 56 of the silicon nitride film of the side walls of the bit lines 48 and the silicon nitride film 54 (FIG. 10B).

Then, a silicon oxide film of, e.g., a 400 nm-thick is deposited on the entire surface by, e.g., CVD method, and the surface is polished by CMP method to form the inter-layer insulation film 58 of the silicon oxide film having the surface planarized.

Figure 10C:
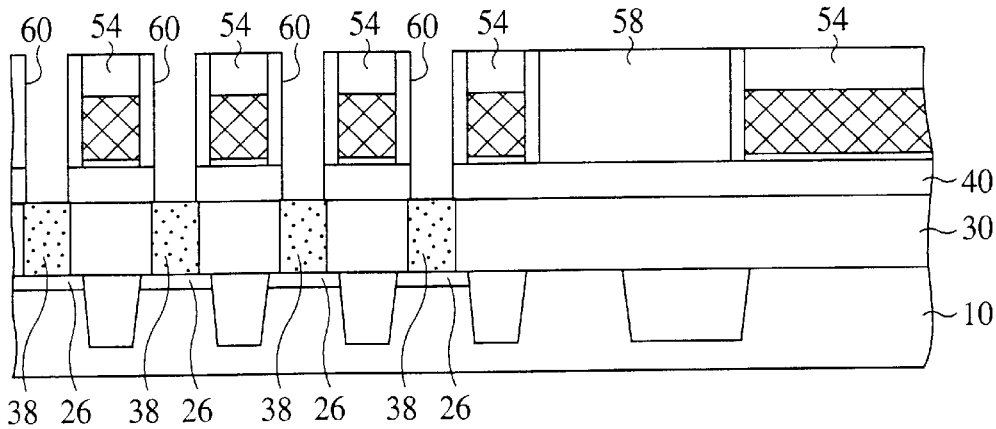

Next, the contact holes 60 are formed in the inter-layer insulation films 58, 40 down to the plugs 38 by lithography and etching (FIG. 10C). The silicon oxide film is etched under etching conditions having high selectivity with respect to the silicon nitride film to thereby open the contact holes 60 by self-alignment with the silicon nitride film 54 covering the upper surface of the bit lines 48 and the sidewall insulation film 56 formed on the side walls of the bit lines 48.

Figure 11A:
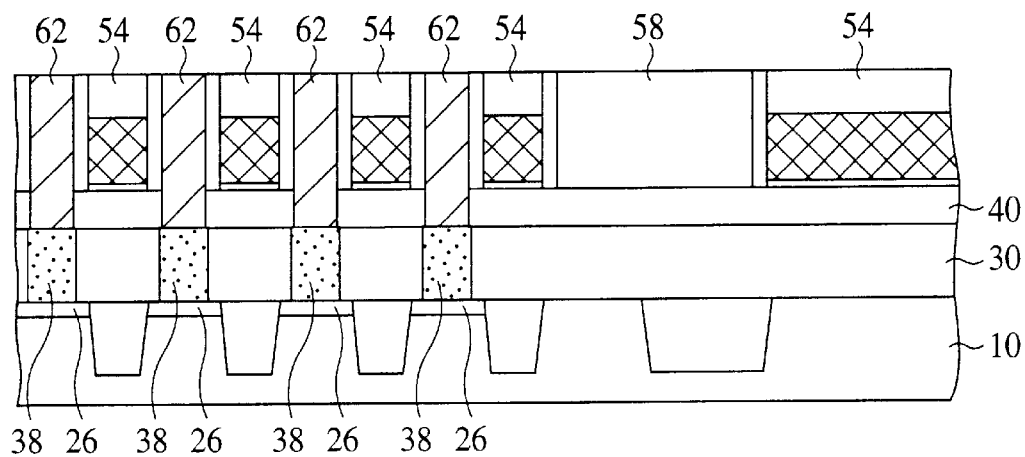

Then, the adhesion layer of a 25 nm-thick layer structure of titanium nitride/titanium, and a 250 nm-thick tungsten film are deposited on the entire surface by, e.g., sputtering method and are polished by CMP method until the surface of the inter-layer insulation film 58 is exposed to thereby form plugs 62 buried in the contact holes 60 (FIG. 11A).

Next, a silicon nitride film of, e.g., an about 40 nm-thick silicon nitride film is deposited on the entire surface by, e.g., CVD method to form the etching stopper film 64 of the silicon nitride film.

Then, a silicon oxide film of, e.g., a 100 nm-thick is deposited on the etching stopper film 64 by, e.g., CVD method to form the inter-layer insulation film 66 of the silicon oxide film.

Then, a silicon nitride film of, e.g., an about 40 nm-thick is deposited on the inter-layer insulation film 66 by e.g., CVD method to form the etching stopper film 68 of the silicon nitride film.

Figure 11B:
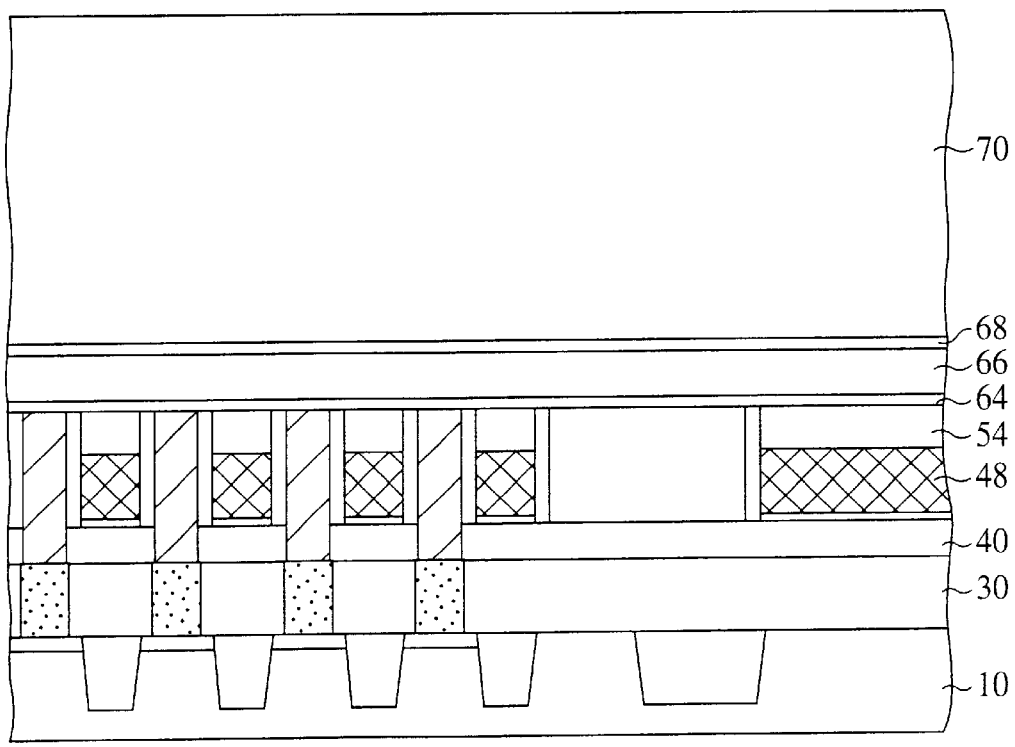

Next, a silicon oxide film of, e.g., a 600 nm-thick is deposited on the etching stopper film 58 by, e.g., CVD method to form the inter-layer insulation film 70 of the silicon oxide film (FIG. 11B).

Figure 12A:
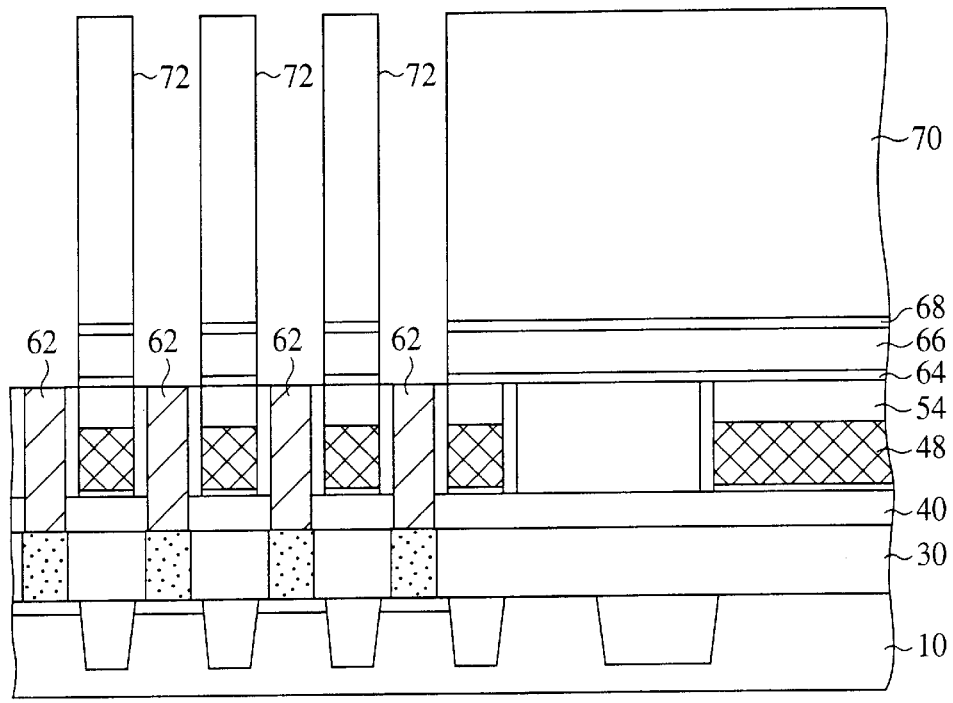

Then, the inter-layer insulation film 70, the etching stopper film 68, the inter-layer insulation film 66 and the etching stopper film 64 are patterned to form openings 72 down to the plugs 62 through these film in regions for the storage electrodes to be formed in (FIG. 12A).

Next, a 10 nm-thick titanium nitride film and a 40 nm-thick ruthenium (Ru) film are deposited on the entire surface by, e.g., CVD method. To form the ruthenium film, $Ru(EtCp)_2$, for example, is used as a ruthenium source, and the film is formed at 330° C. Under these conditions, an oxygen concentration of the ruthenium film can be, e.g., $1 \times 10^{20}$ cm$^{-3}$, and a carbon concentration can be, e.g., $1 \times 10^{20}$ cm$^{-3}$.

Next, a photoresist (not shown) is applied to fill the openings 72 with the titanium nitride film and the ruthenium film formed in.

Figure 12B:
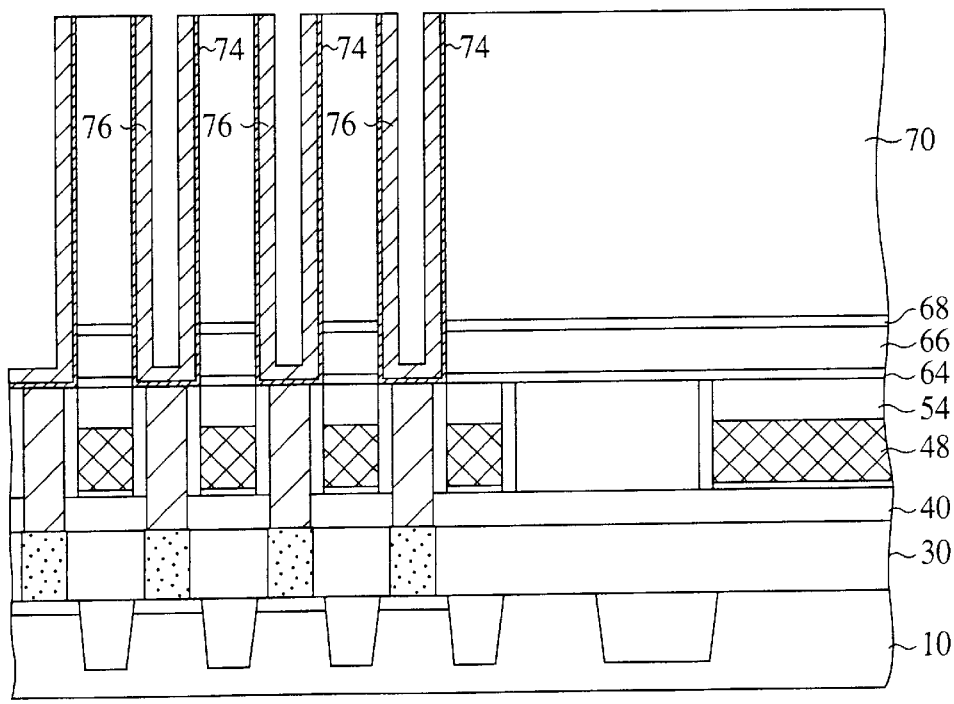

Then, by, e.g., CMP method and reactive ion etching, the photoresist film, the ruthenium film and the titanium nitride film are polished until the surface of the inter-layer insulation film 70 is exposed while the photoresist resist film in the openings 72 is removed, to form along the inside walls of the opening the adhesion layer 74 of the titanium nitride film and the storage electrode 76 of the ruthenium film (FIG. 12B).

Then, the inter-layer insulation film 70 is selectively etched by isotropic etching, such as wet etching using, e.g., an aqueous solution of hydrofluoric acid with the etching stopper film 68 as a stopper.

Figure 13A:
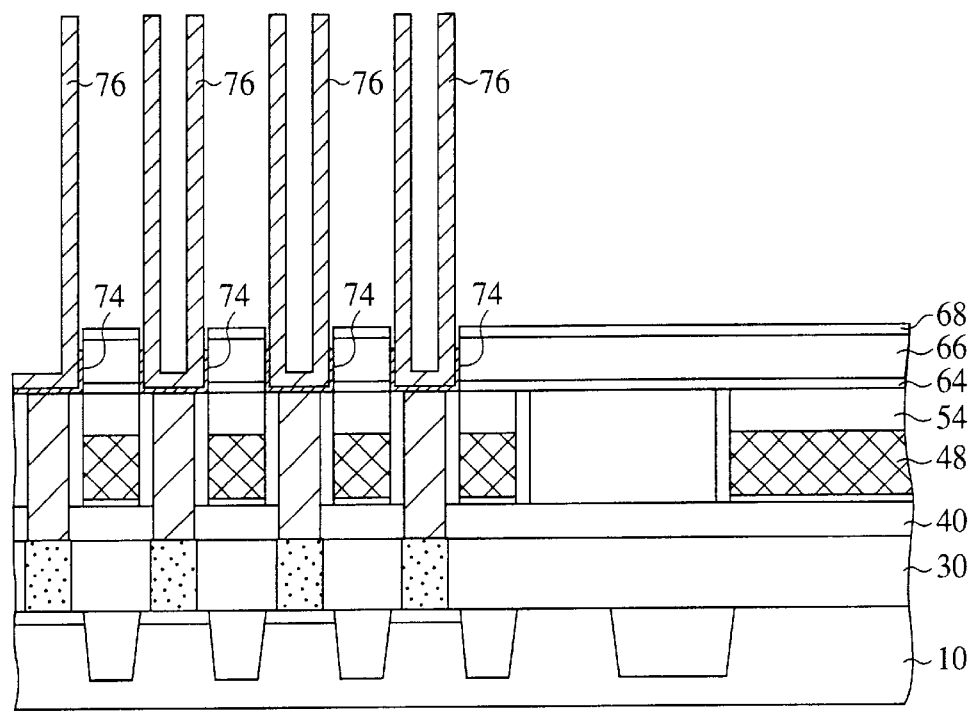

Then, the adhesion layer 74 is etched by an aqueous solution containing, e.g., sulfuric acid and hydrogen peroxide selectively with respect to the storage electrodes 76, the etching stopper film 68 and the inter-layer insulation film 66 (FIG. 13A). This etching is performed in consideration of poor compatibility between the adhesion layer 74 and the capacitor dielectric film 78 to be formed later. When the adhesion layer 74 had good compatibility with the storage electrodes 76, it is not essential to remove the adhesion layer 74. It is preferable that the etching of the adhesion layer 74 is set on until a gap is formed at least between the etching stopper film 68 and the storage electrodes 76. A technique of removing the adhesion layer, based on the compatibility with the capacitor dielectric film is detailed in, e.g., the Laid-Open Japanese Patent Application No. 2000-124423 filed by the applicant of the present application.

Figure 13B:
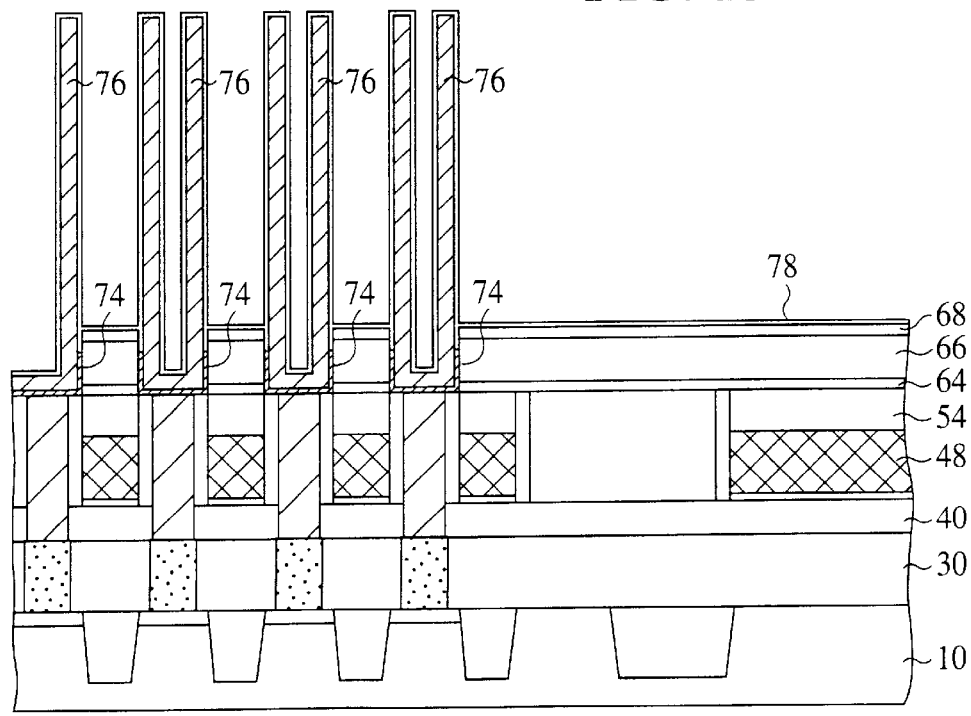

Next, a tantalum oxide film of, e.g., a 10–30 nm-thick is deposited on the entire surface by, e.g., CVD method to form the capacitor dielectric film 78 of the tantalum oxide film (FIG. 13B). The tantalum oxide film is formed, e.g., by using a mixed gas of oxygen and pentoethoxy tantalum (Ta(OC$_2$H$_5$)$_5$) at a 480° C. substrate temperature and at a 1.3 Torr pressure to form the capacitor dielectric film 78 of the tantalum oxide film.

Then, thermal processing is performed in a UV-O$_3$, O$_3$ or H$_2$O atmosphere to fill oxygen vacancies in the tantalum oxide film while accelerating hydrolysis reaction of the PET. The thermal processing is performed, e.g., in UV-O$_3$, at 480° C. and for 2 hours.

Next, a ruthenium film 80 of, e.g., a 30–50 nm-thick is deposited on the entire surface by, e.g., CVD method. For example, an about 10 nm-thick seed layer is formed by sputtering method, and a ruthenium film is deposited by CVD method to thereby form a ruthenium film of a required thickness. To form the ruthenium film by CVD method, Ru(EtCp)$_2$, for example, is used as a ruthenium source, and the film is formed at 300° C. Under these conditions, an oxygen concentration of the ruthenium film can be, e.g., about $1\times10^{21}$ cm$^{-3}$, and a carbon concentration can be, e.g., about $5\times10^{20}$ cm$^{-3}$. The film formed under these conditions contain a large amount of oxygen, and the adhesion between the capacitor dielectric film 78 and the ruthenium film 80 can be improved.

Then, thermal processing is performed in a forming gas atmosphere (3% H$_2$+97% N$_2$) and, e.g., at, e.g., 400° C. for 1 hour to reduce impurities of the ruthenium film 80. An impurity distribution is the ruthenium film after the thermal processing is, e.g., as shown in FIG. 1. The adhesion between the capacitor dielectric film 78 and the ruthenium film 80 (the plate electrode 88) can be further improved.

Next, a TiN film of, e.g., a 50 nm-thick is deposited on the entire surface by, e.g., sputtering method. The TiN film 82 is for improving the adhesion between the plate electrode 88 and the plugs 96.

Figure 14:
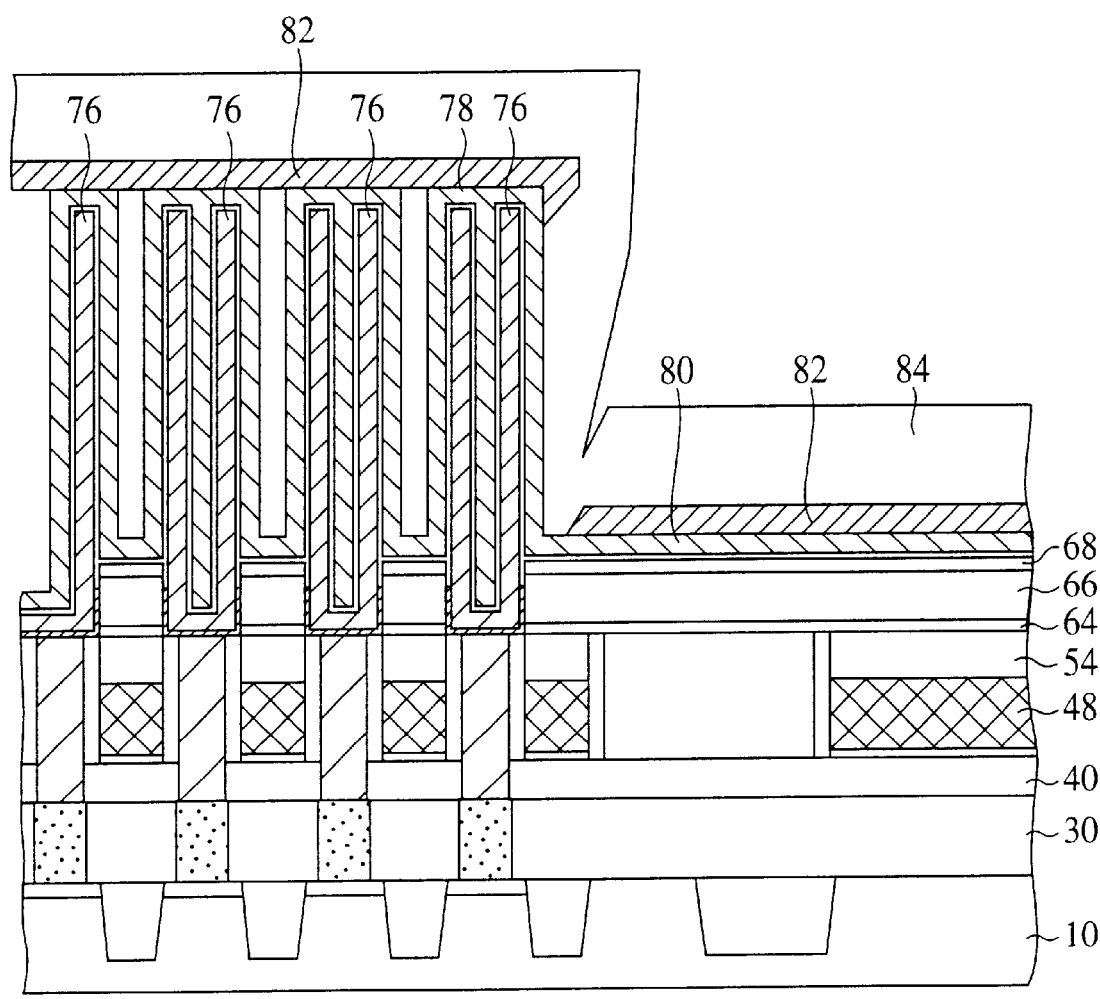

Then, a silicon oxide film of, e.g., a 300 nm-thick is deposited on the entire surface by, e.g., CVD method to form the inter-layer insulation film 84 of the silicon oxide film (FIG. 14).

Next, the inter-layer insulation film 84, the TiN film 82 and the ruthenium film 80 aware patterned by lithography and etching to form the plate electrode 88 of the ruthenium film 80 having the upper surface covered with the TiN film 82 and the inter-layer insulation film 84.

Then, a silicon oxide film of, e.g., a 1000 nm-thick is deposited on the entire surface by, e.g., CVD method, and the surface of the silicon oxide film is polished by CMP method to form the inter-layer insulation film 90 of the silicon oxide film having the surface planarized.

Figure 15:
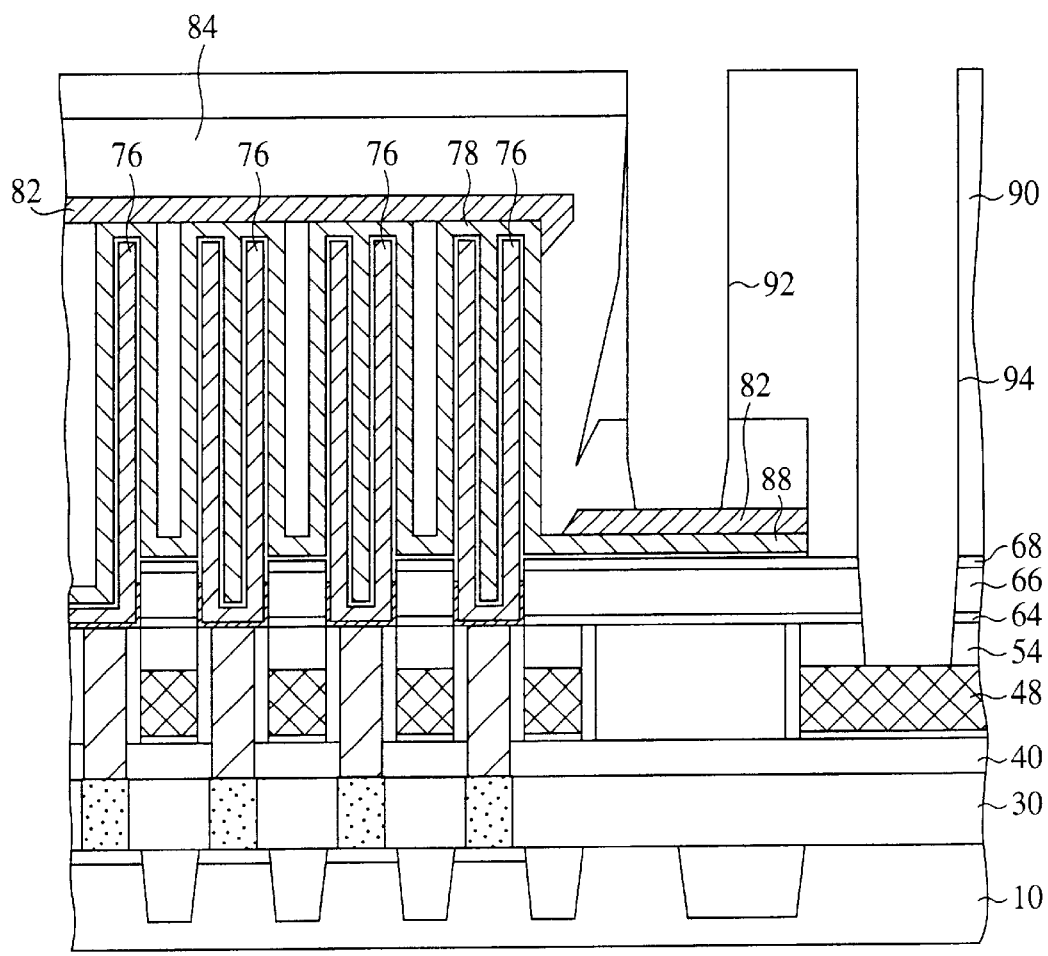

Next, by lithography and etching, contact holes 92 and contact holes 94 are formed respectively down to the plate electrode 88 through the inter-layer insulation film 90 and down to the bit liens 48 through the inter-layer insulation film 90, etching stopper film 68, the inter-layer insulation film 66, the etching stopper film 64 and the silicon nitride film 54 (FIG. 15). For example, the inter-layer insulation films 90, 84, 55 are etched at a 0.05 Torr pressure, with a 1500 W power and at a gas flow rate of C$_4$F$_8$/CO/Ar/O$_2$=15/300/350/5 sccm, which are conditions for ensuring etching selectivity with respect to the silicon nitride film. The etching stopper films 68, 64 and the silicon nitride film 54 are etched at a 0.05 Torr pressure, with a 1500 W power and at a gas flow rate of CHF$_3$/CO/O$_2$=50/150/5 sccm, which are conditions for ensuring etching selectivity with respect to the silicon oxide film.

Figure 16:
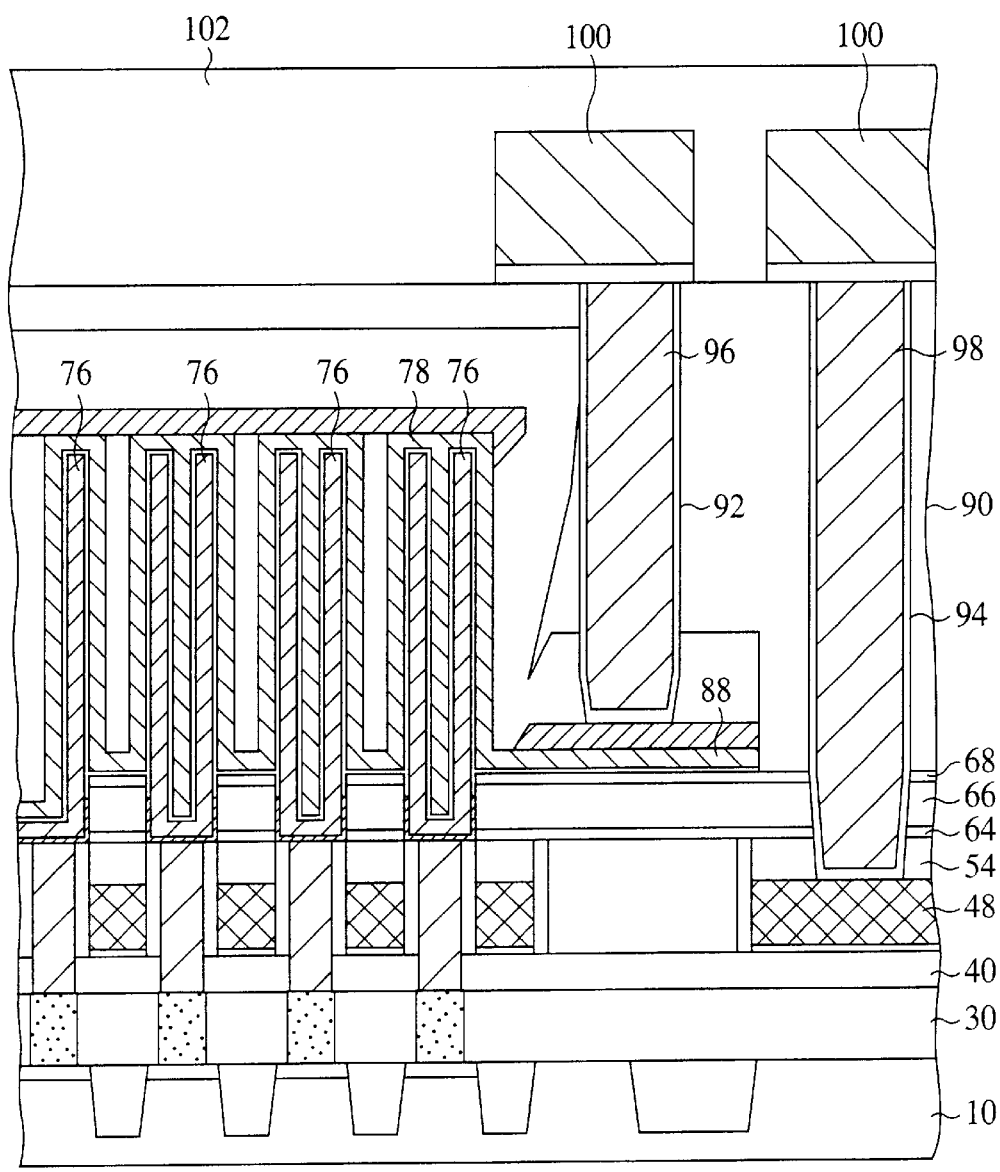

Then, the adhesion layer of a 25 nm-thick titanium nitride/titanium layer film, and a 250 nm-thick tungsten film are deposited on the entire surface by, e.g., sputtering method, and are polished by CMP method until the surface of the inter-layer insulation film 90 is exposed to form the plugs 96 buried in the contact holes 92 and the plugs 98 buried in the contact holes 94 (FIG. 16).

Then, thermal processing is performed in a forming gas atmosphere (3% H$_2$+97% N$_2$) and, e.g., at 400° C. and for 1 hour. The thermal processing is followed by thermal processing in a nitrogen atmosphere and, e.g., at 500° C. for 1 hour. The thermal processing can reduce damage to the capacitors in the back end process until the plugs 96, 98 have been formed, whereby characteristics of the capacitors can be improved.

Next, a 10 nm-thick titanium nitride film to be a barrier metal, a 300 nm-thick aluminum film or copper film are deposited on the entire surface by, e.g., sputtering method and patterned to form the interconnection layer 100 electrically connected to the lower interconnection layer via the plugs 96, 98.

Then, a silicon oxide film of, e.g., a 1000 nm-thick is deposited on the entire surface by, e.g., CVD method, and the surface of the silicon oxide film is polished by CMP method to form the inter-layer insulation film 102 of the silicon oxide film having the surface planarized (FIG. 16).

Then, the contact holes 104 are formed down to the interconnection layer 100 through the inter-layer insulation film 102 by lithography and etching.

Next, the adhesion layer of a 25 nm-thick titanium nitride/titanium layer structure, and a 250 nm-thick tungsten film are deposited on the entire surface by, e.g., sputtering method, and are polished by CMP until the surface of the inter-layer insulation film 102 is exposed to form the plugs 106 buried in the contact holes 104.

Then, a 10 nm-thick titanium nitride film to be a barrier metal and a 300 nm-thick aluminum film or copper film are deposited on the entire surface by, e.g., sputtering method and are patterned to form the interconnection layer 108 electrically connected to the interconnection layer 100 via the plugs 106.

Figure 17:
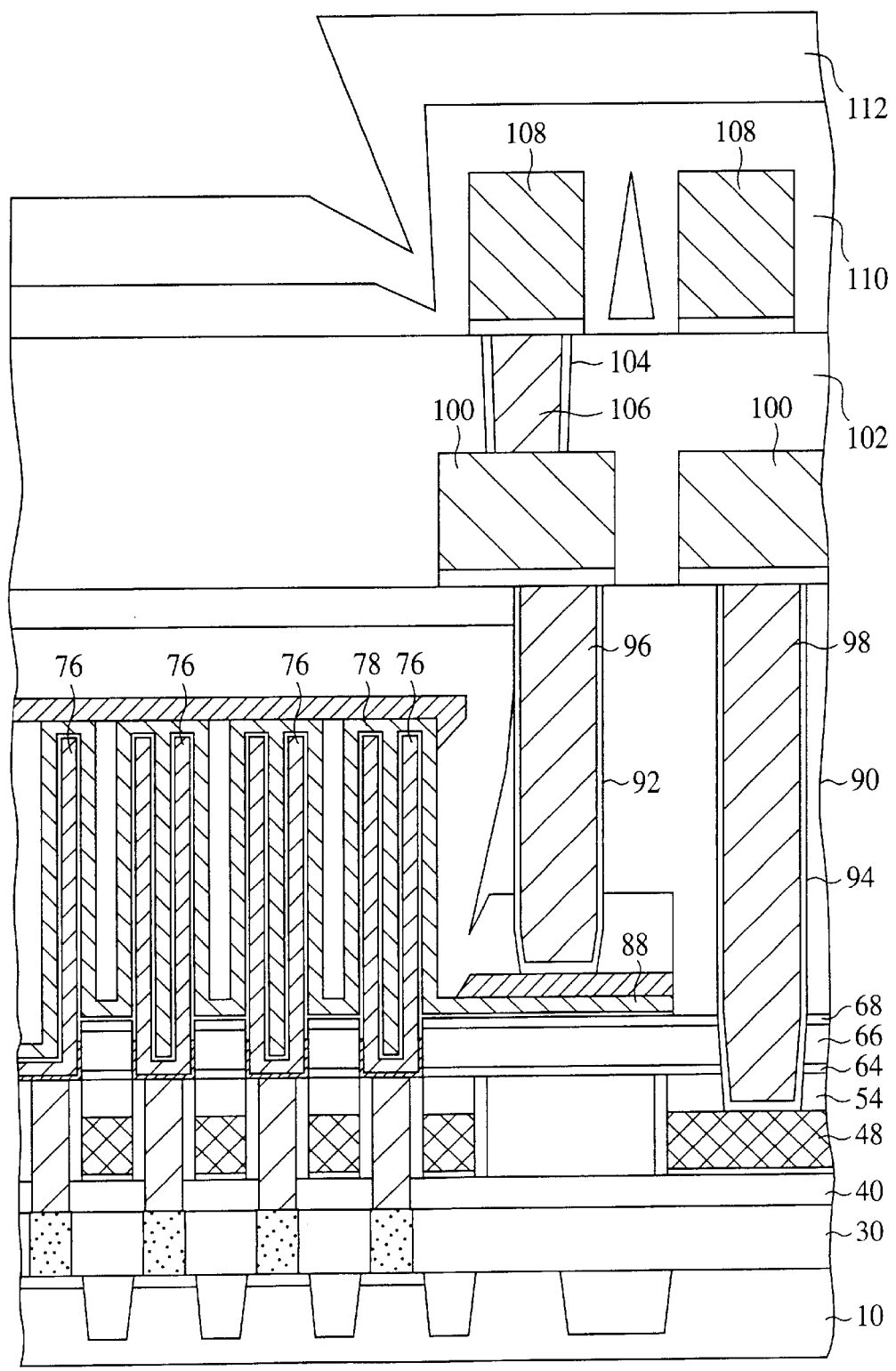
Figure 18A:
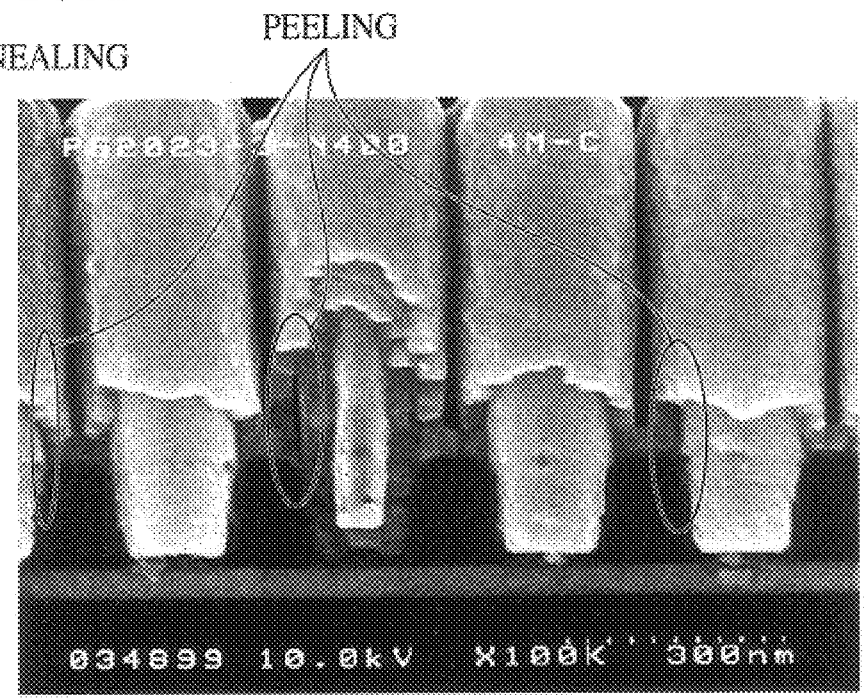
FIGS. 18A–18B are views of sectional structures of the semiconductor device observed by a scanning electron microscope.
Figure 18B:
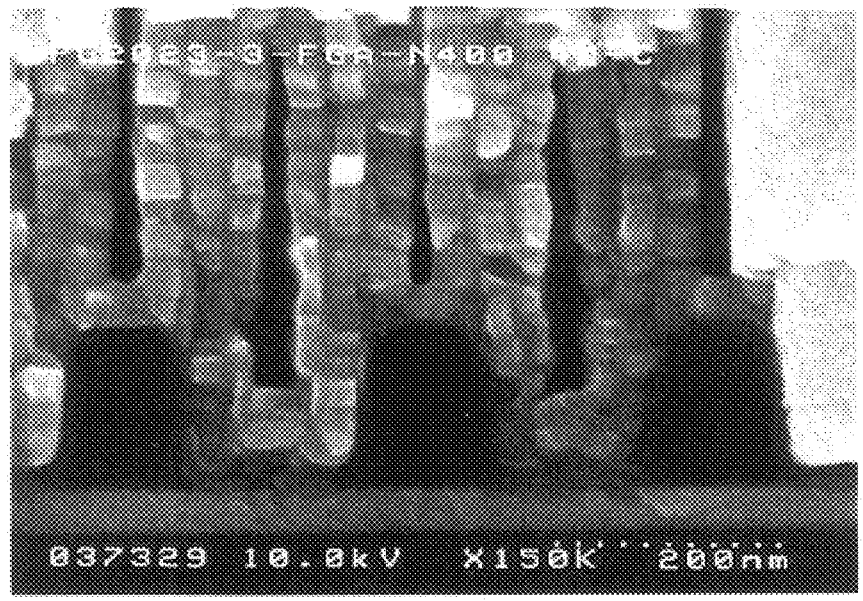

Then, a silicon oxide film 110 of, e.g., a 300 nm-thick and a silicon nitride film 112 of, e.g., a 600 nm-thick are deposited on the entire surface by, e.g., CVD method to form the uppermost passivation film (FIG. 17).

Next, thermal processing is performed in a forming gas atmosphere (3% H$_2$+97% N$_2$) and, e.g., at 400° C. and for 1 hour to recover transistor characteristics.

Thus, the DRAM comprising memory cells each having one transistor and one capacitor is fabricated.

FIGS. 18A and 18B are views of a sectional structures of the semiconductor devices observed by a scanning electron microscope. FIG. 18A shows a sample subjected to thermal processing after the capacitors have been formed, in a nitrogen atmosphere, at 400° C. and for 1 hour. FIG. 18B shows a sample subjected to thermal processing after the capacitors have been formed, in a forming gas atmosphere, at 400° C. and for 1 hour and further subjected to thermal processing in a nitrogen atmosphere, at 400° C. and for 1 hour.

As shown, the sample which has been subjected only to the thermal processing in the nitrogen atmosphere had peeling at the interface between the capacitor dielectric films 78 and the plate electrode 88. However, the sample subjected to the thermal processing in the forming gas atmosphere and to the thermal processing in the nitrogen atmosphere had no peeling.

As described above, according to the present embodiment, the peeling at the interface between the capacitor dielectric film and the plate electrode can be prevented, and degradation of electric characteristics of the capacitors, caused by thermal processing can by reduced.

In the present embodiment, the adhesion of the interface between the capacitor dielectric film and the plate electrode and electric characteristics of the capacitors are improved by (1) performing optimization of conditions for forming the storage electrodes and the plate electrode, (2) performing the thermal processing in the forming gas atmosphere after the ruthenium film to be the plate electrode has been formed and before the patterning, and (3) performing the thermal processing in the forming gas atmosphere in the back end process. However, any one of the above-described means may be used, or combinations of two arbitrary ones of the above-described means may be used.

Thermal processing in a forming gas atmosphere may be further added after the storage electrodes have been formed and before the capacitor dielectric film is formed. By performing this thermal processing, impurity concentrations of the storage electrodes can be decreased, whereby capacitor characteristics can be further improved.

[Modifications]

The present invention is not limited to the above-described embodiment and can cover other various modifications.

For example, in the above-described embodiment, as a typical example, the capacitor dielectric film is exemplified by tantalum oxide film, and ruthenium film is used as the electrode material. The present invention is not limited to the combination of tantalum oxide film and ruthenium film.

As electrode materials, iridium (Ir), rhodium (Rh), platinum (Pt), palladium (Pd) osmium (Os), which are elements of the platinum group having properties common with ruthenium, which is used in the above-described embodiment, can be effectively used. Ruthenium oxide (RuOx), iridium oxide (IrOx) and SRO, which are oxides of these metals, may be also used as electrode materials.

The present invention is applicable to cases where zirconium oxide (ZrOx) film hafnium oxide (HfOx) film, BST film, STO film and PZT film are used as oxide dielectric materials using the above-described conducing materials as the electrode materials.

In the above-described embodiment, the present invention is applied to DRAM. However, the present invention is applicable not only to DRAM but also widely to semiconductor devices having capacitors of the MIM structure. For example, the present invention is applicable to ferroelectric memories using a ferroelectric film as the capacitor dielectric film.

What is claimed is:

1. A capacitor comprising:

a lower electrode of metal;

a capacitor dielectric film formed on the lower electrode; and an upper electrode of a metal formed on the capacitor dielectric film, a carbon concentration in the upper electrode being lower than that in the lower electrode, and an oxygen concentration in the upper electrode being higher than that in the lower electrode.

2. A capacitor according to claim 1, wherein the capacitor dielectric film is formed of an oxide dielectric film.

3. A capacitor according to claim 2, wherein the capacitor dielectric film is formed of at least one material selected from the group consisting of tantalum oxide, zirconium oxide, hafnium oxide, BST, STO, and PZT.

4. A capacitor according to claim 1, wherein the lower electrode includes at least one material selected from the group consisting of ruthenium, iridium, rhodium, platinum, palladium, osmium, ruthenium oxide, iridium oxide, and SRO.

* * * * *